(12) United States Patent
Horie et al.

(10) Patent No.: US 6,387,182 B1
(45) Date of Patent: May 14, 2002

(54) APPARATUS AND METHOD FOR PROCESSING SUBSTRATE

(75) Inventors: Kuniaki Horie; Yukio Fukunaga; Naoaki Ogure; Tsutomu Nakada; Masahito Abe; Mitsunao Shibasaki; Hidenao Suzuki; Yuji Araki; Kiwamu Tsukamoto, all of Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/517,699

(22) Filed: Mar. 2, 2000

(30) Foreign Application Priority Data

| Mar. 3, 1999 | (JP) | ............................. 11-056154 |
| May 21, 1999 | (JP) | ............................. 11-141743 |
| Aug. 11, 1999 | (JP) | ............................. 11-227533 |

(51) Int. Cl.⁷ ........................ B05C 21/00; H01L 21/00
(52) U.S. Cl. ........................ 118/244; 118/63; 118/259; 118/266; 427/349; 427/428; 427/432; 438/3
(58) Field of Search ................ 118/244, 259, 118/266; 427/349, 428, 432; 438/3

(56) References Cited

U.S. PATENT DOCUMENTS 5,393,344 A * 2/1995 Oyagi et al. ................ 118/244

| 5,453,124 A | 9/1995 | Moslehi et al. |
| 5,580,822 A | 12/1996 | Hayakawa et al. |
| 5,595,606 A | 1/1997 | Fujikawa et al. |
| 5,950,646 A | 9/1999 | Horie et al. |

FOREIGN PATENT DOCUMENTS

| EP | 835 950 A | 4/1998 |
| JP | 60189928 | 9/1985 |
| JP | 10060650 | 3/1998 |
| JP | 11-33303 | 2/1999 |

* cited by examiner

Primary Examiner—David Nelms
Assistant Examiner—Reneé R. Berry
(74) Attorney, Agent, or Firm—Wenderoth, Lind & Ponack, L.L.P.

(57) ABSTRACT

A substrate processing apparatus forms a thin film of high-dielectric or ferroelectric such as barium/strontium titanates, or a copper film for wiring on a substrate, and has a gas ejection head for individually introducing at least two gases including a material gas and ejecting the gases toward a substrate to be processed. The gas ejection head has at least two gas passageways for individually introducing the two gases, and at least two temperature control devices for individually controlling temperatures of the gases flowing through the gas passageways.

19 Claims, 9 Drawing Sheets

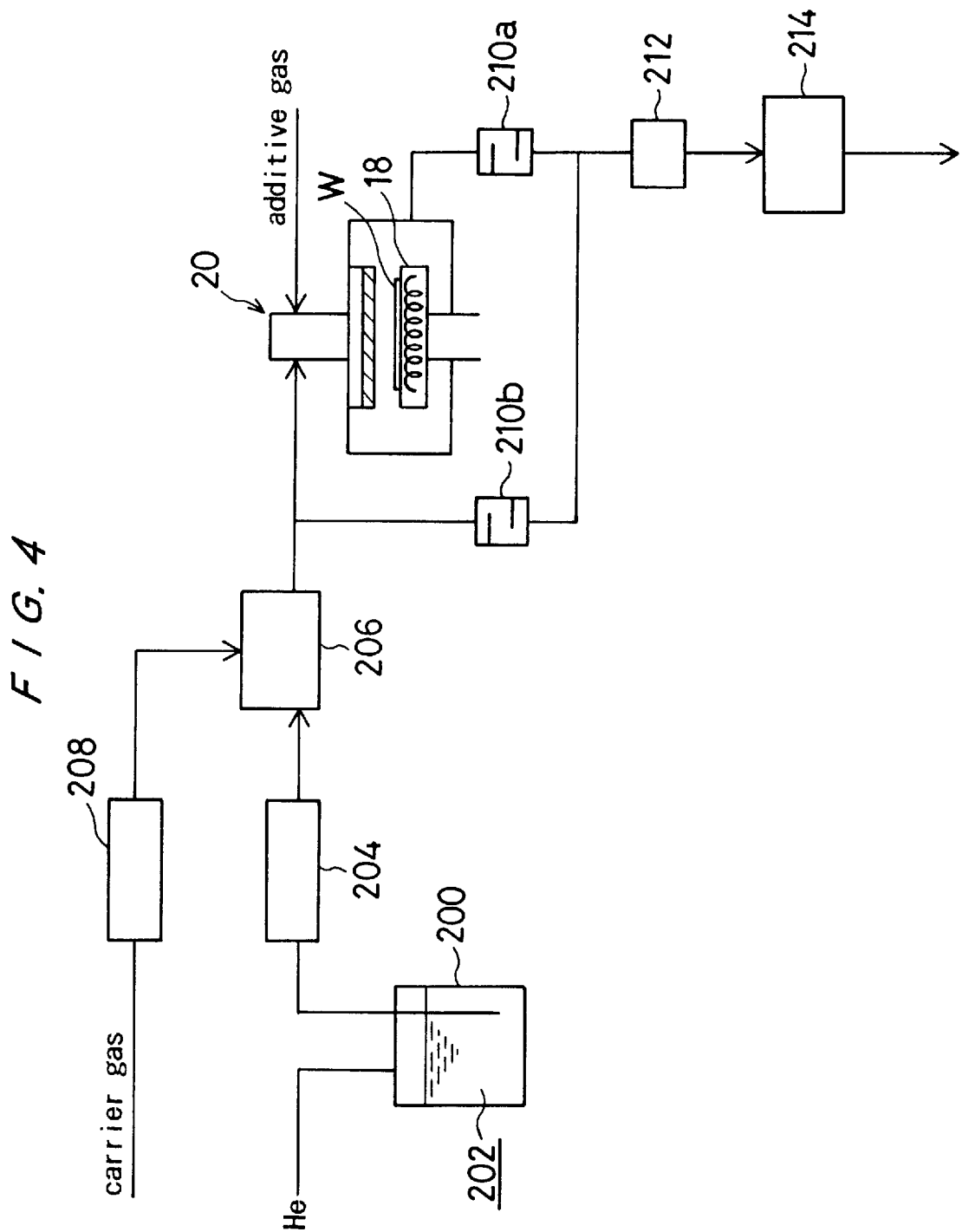

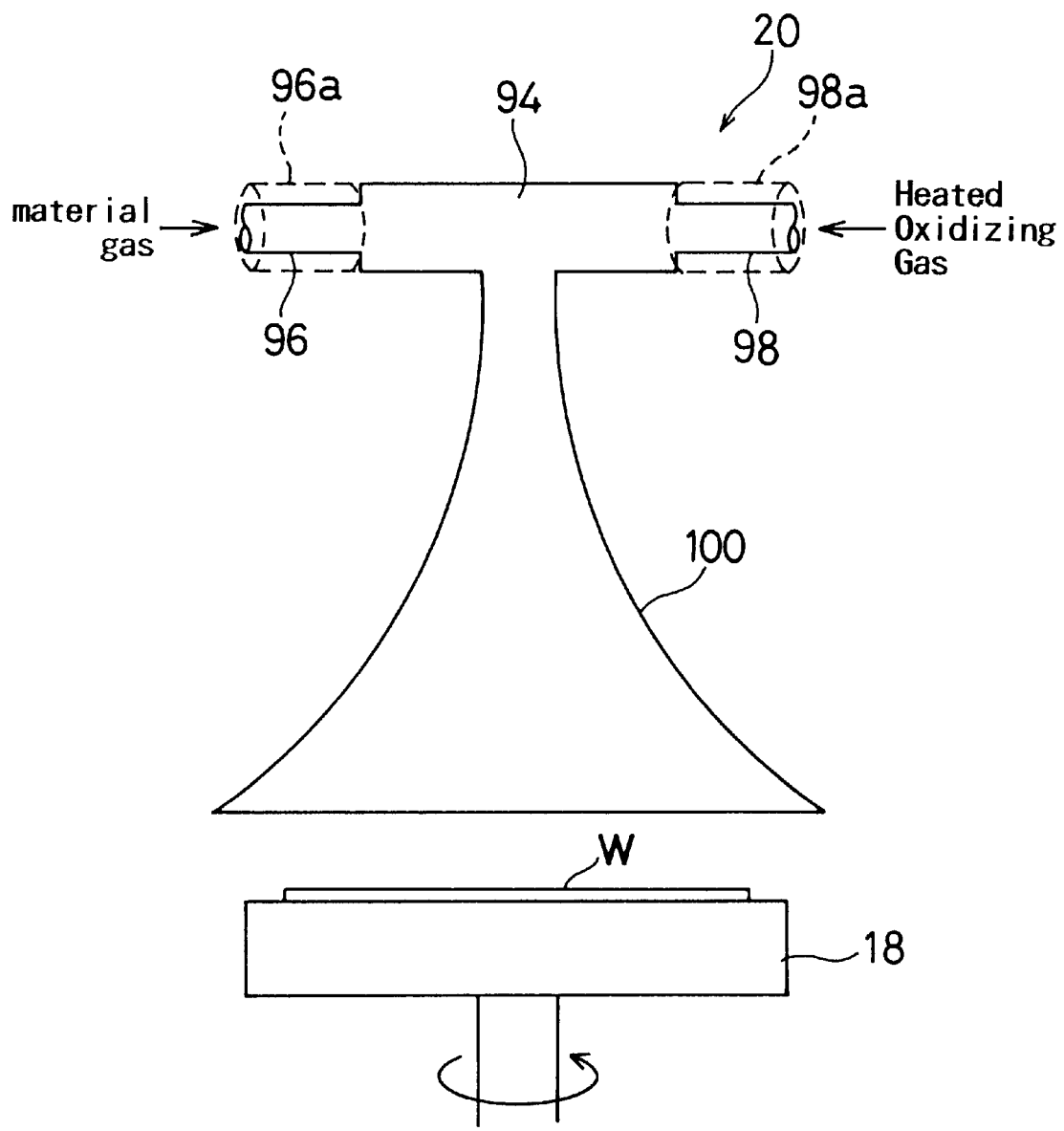

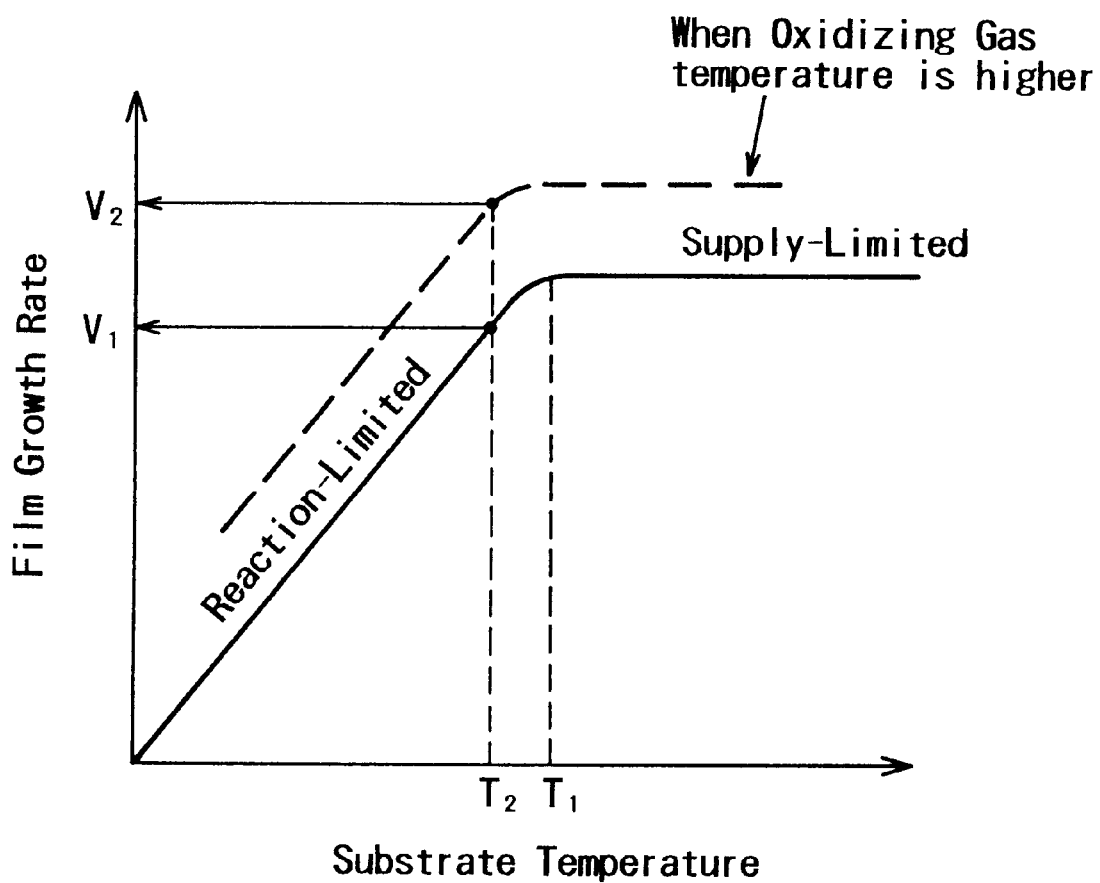
F I G. 10

T: Film Growth Temperature

APPARATUS AND METHOD FOR PROCESSING SUBSTRATE

BACKGROUND OF THE INVENTION

1. Field of the Invention

The present invention relates to an apparatus and method for processing a substrate, and more particularly to an apparatus and a method for processing a substrate to form a thin film of high-dielectric or ferroelectric such as barium/strontium titanates, or a copper film for wiring on the substrate, or to etch the substrate.

2. Description of the Related Art

Recently, in the semiconductor manufacturing industry, the integration of integrated circuits has been improved remarkably, and the research and development activities of DRAM are being intensively carried out in anticipation of gigabit order DRAMs which will replace current megabit order DRAMs. The capacitor element having a large capacity per unit area is needed to produce such DRAMs. As a dielectric thin-film material for producing elements having such a large capacity per unit area, in place of silicon oxide or silicon nitride having a dielectric constant of less than 10, a metallic oxide film material such as tantalum pentaoxide ($Ta_2O_5$) having a dielectric constant of approximately 20, or barium titanate ($BaTiO_3$) or strontium titanate ($SrTiO_3$) or barium strontium titanate having a dielectric constant of approximately 300 is considered to be a promising thin-film material. Further, a ferroelectric material having a higher dielectric constant is also considered to be a promising thin-film material.

In addition to the above, as a wiring material, copper which has a value of resistance lower than aluminum and a superior resistance against electromigration is considered to be a promising material. As a material for gate insulating film, BiVO, $Bi_4Ti_4O_{12}$, $YMnO_3$, ZnO, ZnS, and CdS are considered to be promising materials. As an electrode material having a perovskite structure, $SrRuO_3$, $BaRuO_3$, IrO, and $CaRuO_3$ are considered to be promising materials. As a material for a barrier layer or a buffer layer, MgO, $Y_2O_3$, YSZ, and TaN are considered to be promising materials. As a superconductivity material, La—Ba—Cu—O, La—Sr—Cu—O, Y—Ba—Cu—O, Bi—Sr—Ca—Cu—O, Tl—Ba—Ca—Cu—O, and Hg—Ba—Ca—Cu—O are considered to be promising materials.

Processes for forming films of the above materials include plating, sputtering, chemical vapor deposition (CVD), and the like. The CVD process is expected to be most favorable for forming films as wiring having small widths. FIG. 9 of the accompanying drawings shows a substrate processing apparatus (chemical vapor deposition apparatus) for forming a thin film of high-dielectric or ferroelectric such as barium/strontium titanates, on a substrate. The substrate processing apparatus (vapor deposition apparatus) comprises a vaporizer (gas generator) 120 for vaporizing a liquid material, a hermetically sealable reaction chamber (processing chamber) 124 disposed downstream of the vaporizer 120 and connected to the vaporizer 120 through a material gas passage 122, and a vacuum pump 126 disposed downstream of the reaction chamber 124 and provided in an evacuation passage 128. An oxidizing gas pipe 130 for supplying an oxidizing gas such as oxygen is connected to the reaction chamber 124.

In the vapor deposition apparatus having the above structure, a substrate W is placed on a substrate holder 134 for holding and heating the substrate W, and a mixture of material gas and oxidizing gas is ejected over the substrate W from gas ejection ports 136 of a gas ejection head 138 while keeping the substrate W at a predetermined temperature, thereby depositing a thin film on a surface of the substrate W. In this case, it is necessary to supply the material gas stably to the substrate W in the reaction chamber 124. The material gas is produced by liquidizing $Ba(DPM)_2$, $Sr(DPM)_2$ or the like which is solid at room temperature, mixing the liquidized substance with organic solvent such as tetrahydrofuran (THF) for stabilizing vaporization characteristics, and vaporizing the obtained mixture by the vaporizer 120.

When a plurality of organic metal materials are used to form a film, the substrate processing apparatus tends to suffer certain problems. Specifically, since the organic metal materials have their inherent vaporization temperatures and decomposition temperatures, a temperature range in which the organic metal materials can exist stably in their vapor phase is generally narrow. A simple organic metal material gas which is mixed with the organic solvent cannot vaporize if the organic solvent vaporizes earlier. Therefore, it is necessary to vaporize the organic metal material gas and the organic solvent at the same time. If the material gas is subjected to a temperature irregularity while it is being supplied to the substrate, then the material gas is liable to be condensed or decomposed, and the temperatures of some of the organic metal materials have to be controlled so as to be lower than the vaporization temperature of any one of the materials.

For example, it is assumed that an organic metal material A has a vaporization temperature $T_{KA}$ and a decomposition temperature $T_{DA}$, and an organic metal material B has a vaporization temperature $T_{KB}$ and a decomposition temperature $T_{DB}$. If $T_{KB}<T_{KA}<T_{DB}<T_{DA}$, then a temperature range in which the materials A, B can exist stably in their vapor phase is from $T_{KA}$ to $T_{DB}$. If $T_{KB}<T_{DB}<T_{KA}<T_{DA}$, then in order to suppress decomposition of the organic metal material B, the process temperature needs to be controlled so as to be equal to or lower than the vaporization temperature of the organic metal material A.

The inventors of the present application have found that the film growth rate and the substrate temperature are related to each other as shown in FIG. 10 of the accompanying drawings. As shown in FIG. 10, when the heater of the substrate holder heats the substrate W to a film growth temperature $T_1$, the rate vs. temperature curve exhibits the reaction-limited in which the film growth rate increases in proportion to the substrate temperature until the film growth temperature $T_1$ is reached, and the supply-limited in which the film growth rate is substantially constant beyond the film growth temperature $T_1$. The material gas is introduced into the reaction chamber at a low temperature that is substantially the same as the vaporization temperature in order to suppress reaction and decomposition of the material gas, and an oxidizing gas for reaction with the material gas is also introduced at the same low temperature. Therefore, the surface of the substrate is held at a temperature $T_2$ which is lower than the film growth temperature $T_1$, with the result that the substrate processing apparatus cannot perform its maximum capability.

As semiconductor devices become more highly integrated, their structural details become finer, and a more uniform film needs to be deposited on their finer uneven surfaces. For example, as shown in FIG. 11 of the accompanying drawings, when a thin film 142 of high-dielectric or ferroelectric is grown in a minute hole or trench 140 (in some case stack structure is also available) defined in the surface of a semiconductor substrate W, coverage characteristics including the ratio of a film thickness B on the bottom of the groove 140 to a film thickness A on the surface of the semiconductor substrate W, i.e., the ratio B/A (bottom coverage), the ratio of a film thickness C on a side of the groove 140 to the film thickness A, i.e., the ratio C/A (side coverage), and the ratio of a film thickness $C_2$ on an upper portion of the side of the groove 140 to a film thickness $C_1$ on a lower portion of the side of the groove 140, i.e., $C_2/C_1$ (side coverage uniformity), are required to be increased.

For increasing the above coverage characteristics, a film may be grown according to the reaction-limited of an Arrhenius' curve which represents the relation of the film growth rate and the reciprocal of the film growth temperature as shown in FIG. 12 of the accompanying drawings. If a film were grown according to the supply-limited, then, as shown in FIG. 13A of the accompanying drawings, the supply of particles (molecules) 144 of a material gas (film forming gas) would fail to catch up with the reaction, and the particles (molecules) 144 of the material gas would react and be deposited on a surface which they have first reached. As a result, the particles (molecules) 144 of the material gas become sparse in the groove 140, and the film growth in the groove 140 becomes smaller than the film growth on the surface of the substrate W, resulting in poor coverage characteristics. If a film is grown according to the reaction-limited, then, as shown in FIG. 13B of the accompanying drawings, the reaction of particles (molecules) 144 of the material gas fails to catch up with the supply of particles (molecules) 144, so that the probability of attachment of material gas particles (molecules) is low. Thus, a particle (molecule) 144 of the material gas does not contribute to film growth at a spot X which it has first reached, but is deposited at a next spot Y. Consequently, a film can be grown in the groove 140 according to the same film growth characteristics as on the surface of the substrate W, resulting in good coverage characteristics.

However, the reaction-limited (the supply of particles (molecules) is sufficient) is a phenomenon in which the reaction rate increases as the film growth temperature rises, and the supply-limited (the supply of particles (molecules) is insufficient) is a phenomenon in which the reaction rate is substantially constant regardless of a rise in the film growth temperature. Therefore, when a film is grown according to the reaction-limited, the film growth rate is lowered. Accordingly, the reaction rate and the coverage characteristics are correlated such that if one of the reaction rate and the coverage characteristics becomes better, the other becomes worse.

The substrate processing apparatus for processing substrates one by one are required to shorten a processing time per substrate in a processing chamber for thereby increasing the number of substrates processed per time by the apparatus. The processing time in the processing chamber is roughly divided into the following periods:

1) Heating period for heating a substrate (preheating time); and
2) Processing period for actually forming a film on a substrate or etching a substrate.

If the processing period 2) is essentially short as in a process of growing a copper film, then the length of the heating period (preheating time) 1) forms a bottleneck in increasing the throughput.

According to a conventional process for heating (preheating) a substrate in a processing chamber with a heating device, a substantial heat capacity is required to maintain temperature stability of the substrate. Inasmuch as a heater having a large time constant in increasing or reducing the temperature is generally used as the heating device, when the temperature of the substrate becomes close to a target temperature, the temperature difference between the substrate and the heating device (heater) is reduced, thus requiring a very long time for the substrate to reach the target temperature.

In order to improve the temperature rising characteristics of a substrate, the heating device may have a temperature adjusting device for setting a heating temperature of the heater higher than the target temperature of the substrate, and the temperature of the heater may be controlled to provide a large temperature difference when the substrate temperature becomes close to the target temperature, for thereby shortening the time required for the substrate to reach the target temperature. However, this scheme is also disadvantageous in that when the substrate temperature becomes close to the target temperature, it is necessary to effect temperature control to lower the temperature of the heater to reach the target temperature, and the heating process becomes time-consuming unless forced cooling is performed on the substrate.

SUMMARY OF THE INVENTION

It is therefore an object of the present invention to provide an apparatus and a method for processing a substrate which can form a film on the substrate using two or more film materials by stably supplying the film materials for an increased film growth rate.

Another object of the present invention is to provide an apparatus and a method for processing a substrate which can increase coverage characteristics while maintaining a high film growth rate.

Still another object of the present invention is to provide an apparatus and a method for processing a substrate which can heat the substrate uniformly and quickly in a processing chamber for an increased throughput.

According to an aspect of the present invention, there is provided an apparatus for processing a substrate, comprising a gas ejection head for individually introducing at least two gases including a material gas and ejecting the gases toward a substrate to be processed. The gas ejection head has at least two gas passageways for individually introducing the at least two gases, and at least two temperature control devices for individually controlling or maintaining temperatures of the gases flowing through the gas passageways.

With the above arrangement, the at least two gases including the material gas can individually be controlled or maintained in temperature irrespectively of each other and set to temperatures optimum for processing a substrate, e.g., forming a film on the substrate, and then can be ejected from the gas ejection head toward the substrate.

Each of the at least two gases contains at least two different organic metal materials. The gases containing the two different organic metal materials can individually be set to desired temperatures irrespectively of each other. The gases thus set to the desired temperatures do not react prematurely and are not decomposed in passageways. When the gases are finally mixed with each other, they can be kept at a higher temperature for an increased film growth reaction rate.

One of the at least two gases comprises a high-temperature gas containing at least one of an oxidizing gas, $N_2$, and an inert gas. When oxides such as BST, Yl or PZT are deposited on the substrate, the material gas ejected from the gas ejection head can be heated by the high-temperature gas containing at least one of an oxidizing gas, $N_2$, and an inert gas, so that the temperature of the mixture of the gases can be made close to a temperature of about 450° C. optimum for film growth.

In the case where oxygen is contained in a material gas used for forming a film, in place of an oxidizing gas, a process in which a gas such as $N_2$ gas or an inert gas is heated to a high temperature and mixed with the material gas is considered.

One of the at least two gases comprises a high-temperature gas containing at least one of a reducing gas, $N_2$, and on inert gas. When metals such as copper are deposited, the material gas ejected from the gas ejection head can be heated by the high-temperature gas containing at least one of a reducing gas, $N_2$, and an inert gas, so that the temperature of the mixture of the gases can be made close to a temperature optimum for film growth.

One of the at least two gases comprises a temperature-adjusting gas for heating the substrate and/or cooling the substrate. A gas passageway for the temperature-adjusting gas in the gas ejection head may be provided separately from a low-temperature gas passageway through which the material gas flows. With the gas passageway for the temperature-adjusting gas being provided independently of the gas passageway for the material gas, the effect of the temperature of the temperature-adjusting gas on the material gas is eliminated when the temperature-adjusting gas is replaced by the material gas, and these gases are prevented from being mixed together.

According to another aspect of the present invention, there is provided an apparatus for processing a substrate, comprising: a processing chamber having a gas ejection head for individually introducing at least two gases including a material gas and ejecting the gases toward a substrate to be processed, the gas ejection head having at least two gas passageways for individually introducing the at least two gases, and at least two temperature control devices for individually controlling or maintaining temperatures of the gases flowing through the gas passageways; a gas supply source for supplying the gases to the gas ejection head; and a substrate holder disposed in the processing chamber in confronting relationship to the gas ejection head.

According to still another aspect of the present invention, there is provided an apparatus for processing a substrate, comprising: a processing chamber for processing a substrate therein; a substrate holder disposed in the processing chamber, for holding and heating the substrate; and a temperature-adjusting gas introducing device for introducing a temperature-adjusting gas into the processing chamber to perform at least one of heating the substrate and cooling the substrate, in a predetermined position in the processing chamber.

Gases can easily be controlled so as to be turned on and off during their flow. A temperature-adjusting gas having a temperature higher than a target temperature may be used to heat a substrate. When the temperature of the substrate reaches the target temperature, the supply of the temperature-adjusting gas is stopped, or when the temperature of the substrate reaches a temperature close to the target temperature, a gas having a temperature close to the target temperature is supplied, for thereby heating (preheating) and/or cooling the substrate quickly to equalize the temperature of the substrate to the target temperature. The temperature-adjusting gas is preferably composed of an $H_2$ gas or the like which has a large specific heat and thermal conductivity for shortening the period of time required to increase or reduce the temperature of the substrate. If an $H_2$ gas poses a problem with regard to the process of forming films, then the temperature-adjusting gas may be an $N_2$ gas or an inert gas.

If the substrate is cooled at a position spaced from the substrate holder, then the temperature of a heating mechanism combined with the substrate holder does not need to be varied. As a result, the substrate can be cooled quickly, and the period of time required for processing the substrate can be shortened for an increased throughput. The substrate may be heated while being placed on the substrate holder for higher efficiency due to the conduction of heat from the substrate holder. However, in order to avoid a heat shock to the substrate, the substrate is preferably heated above the substrate holder. If the substrate is heated above the substrate holder, then radiant heat from the substrate holder can also be utilized to heat the substrate, the substrate can easily be handled, and no extra space is required. Specifically, the substrate may be lifted off the substrate holder by pins combined with the substrate holder. By heating the substrate at this position, since the substrate is not affected by the temperature of the substrate holder, it is possible to perform heat treatment such as annealing of the substrate after forming a film at a temperature different from the temperature for forming the film by flowing a certain gas at a certain temperature. The pins may comprise pins that can project upwardly from the substrate holder, as used heretofore to deliver substrates.

A ring-shaped gas inlet pipe may be disposed in an upper space in the processing chamber, and the temperature-adjusting gas may be ejected from gas ejection ports defined in the gas inlet pipe at a given pitch in the circumferential direction of the gas inlet pipe. The ring-shaped gas inlet pipe allows a substrate processing apparatus which cannot have a gas ejection head due to structural limitations, e.g., a substrate processing apparatus for processing a substrate for ECR, to process the substrate in the manner described above.

According to yet another aspect of the present invention, there is provided a method for processing a substrate, comprising: individually controlling or maintaining temperatures of at least two gases including a material gas; and introducing the gases into a processing chamber.

Each of the at least two gases contain at least two different organic metal materials.

One of the at least two gases comprises a high-temperature gas containing at least one of an oxidizing gas, $N_2$, and an inert gas.

One of the at least two gases comprises a high-temperature oxidizing gas containing at least one of a reducing gas, $N_2$, and an inert gas.

The method further comprises introducing at least one of the at least two gases, excluding the material gas, into the processing chamber at a temperature which is equal to or lower than the temperature of the material gas. Therefore, the temperature of an additive gas, such as an oxidizing gas or a hydrogen gas other than the material gas, can be lowered without varying the temperature of the material gas which is unstable and liable to be condensed relatively easily, thus lowering the reactivity of at least one of the two or more gases that contribute to the reaction for improving coverage characteristics, and the substrate can be maintained at a high temperature for keeping a high film growth rate.

The method further comprises delivering the material gas and the gas to be introduced into the processing chamber at a temperature which is equal to or lower than the temperature of the material gas, without being mixed with each other, and mixing the material gas and the gas with each other in the processing chamber or prior to being introduced into the processing chamber.

The gas to be introduced into the processing chamber at a temperature which is equal to or lower than the temperature of the material gas has a temperature equal to or lower than a condensation temperature of the material gas. The material gas and the gas, such as an oxidizing gas, are prevented from being mixed with each other at an early stage while being delivered, and hence from separating out substances, and the material gas is also prevented from being condensed.

According to yet still another aspect of the present invention, there is provided a method for processing a substrate, comprising: introducing a material gas containing an organic metal material of titanium and a material gas containing another organic metal material into a processing chamber to deposit a thin film on a substrate; wherein the material gas containing the organic metal material of titanium has a temperature equal to or lower than the temperature of the material gas containing the other organic metal material.

An organic metal material of titanium (Ti) has a lower vaporization temperature than those of other organic metal materials of barium (Ba), strontium (Sr), etc., and can be delivered without condensation when individually lowered in temperature separately from the other organic metal materials and vaporized. When the temperature of only the titanium material is made lower than the temperature of the other materials, the reaction of the titanium material is delayed for improved coverage characteristics. BST is a solid solution of BTO and STO, and forms a film due to a reaction of between Ti and Ba, Ti and Sr. Consequently, the coverage characteristics can be controlled by controlling the temperature of the reaction of the Ti material.

The method further comprises delivering the material gas containing the organic metal material of titanium and the material gas containing the other organic metal material, without being mixed with each other, and mixing the material gas containing the organic metal material of titanium and the material gas containing the other organic metal material with each other in the processing chamber or prior to being introduced into the processing chamber.

According to a further aspect of the present invention, there is provided a method of processing a substrate, comprising: holding a substrate by a substrate holder in a processing chamber; and ejecting a temperature-adjusting gas toward said substrate to perform at least one of heating the substrate and cooling the substrate, in a predetermined position in said processing chamber.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 4 is a block diagram showing a film forming process for forming a Cu seed layer for wiring of Cu;

FIG. 6 is a schematic cross-sectional view of a gas ejection head of a substrate processing apparatus according to a third embodiment of the present invention;

FIG. 10 is a diagram showing the relationship between film growth rates and substrate temperatures;

DETAILED DESCRIPTION OF THE PREFERRED EMBODIMENTS

Next, an apparatus and a method for processing a substrate according to embodiments of the present invention will be described below with reference to FIGS. 1 through 8.

Figure 1:
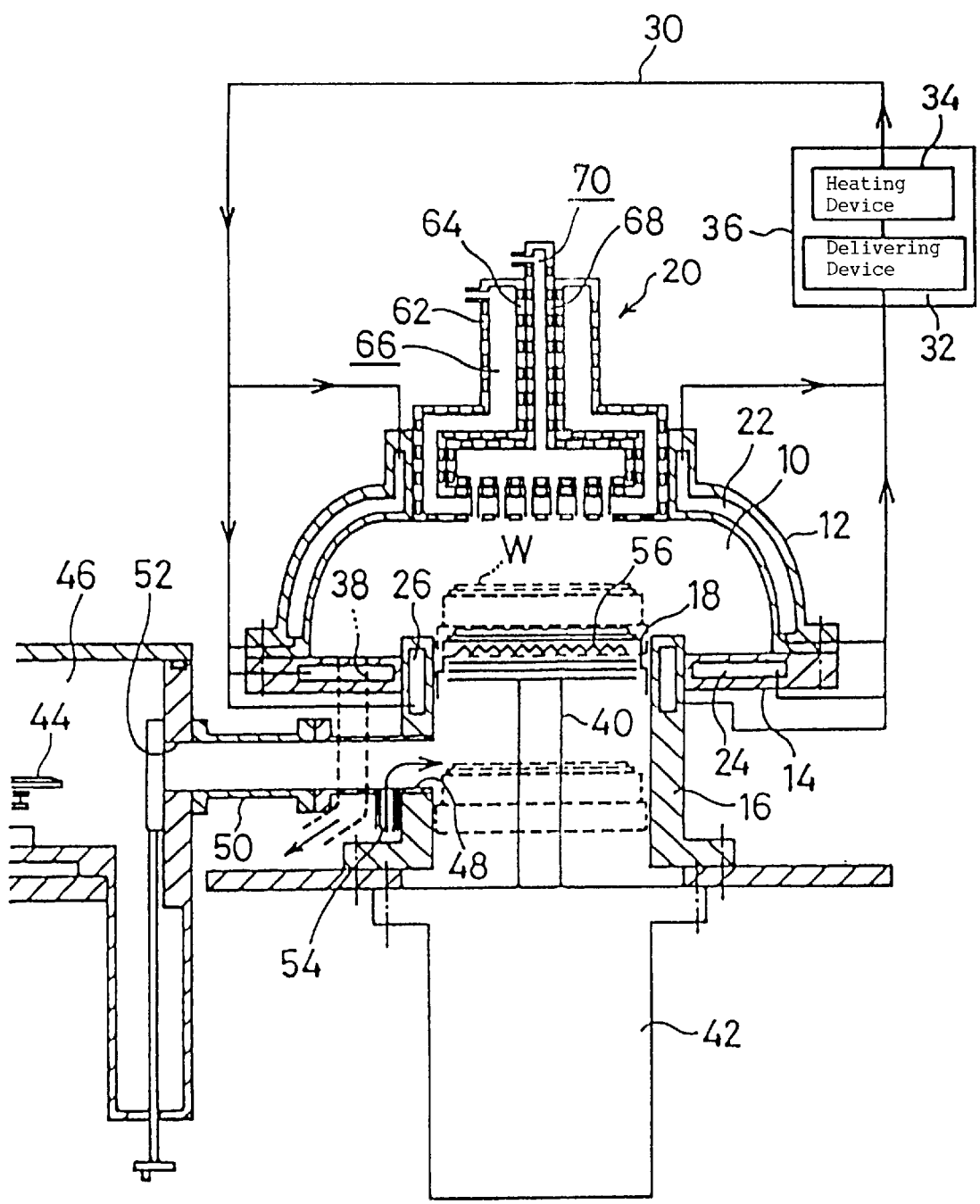
FIG. 1 is a schematic cross-sectional view of a substrate processing apparatus according to a first embodiment of the present invention.
Figure 2:
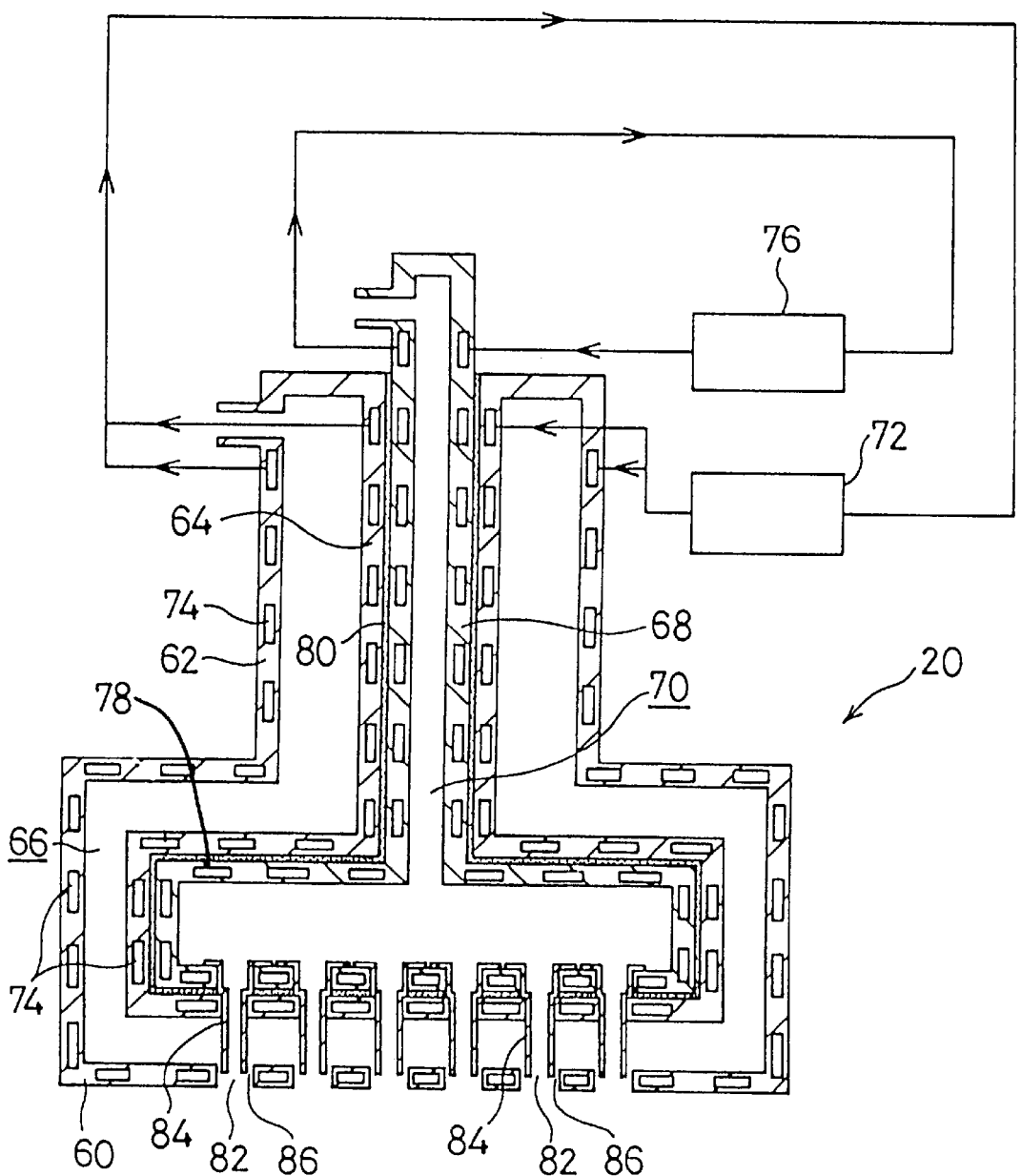
FIG. 2 is an enlarged cross-sectional view of a gas ejection head of the substrate processing apparatus shown in FIG. 1.
Figure 3:
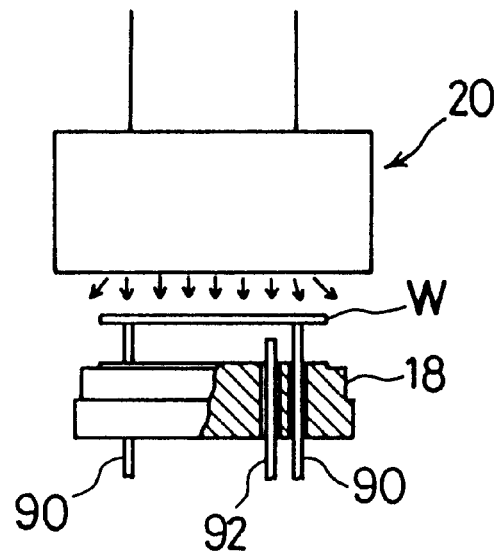
FIG. 3 is an elevational view, partly in cross section, of a substrate holder in the substrate processing apparatus shown in FIG. 1.

FIGS. 1 through 3 show a substrate processing apparatus according to a first embodiment of the present invention. The substrate processing apparatus comprises a dome-shaped casing 12 which defines therein a hermetically sealed reaction chamber (processing chamber) 10, a substrate holder (susceptor) 18 vertically movable in a tubular body 16 whose upper end is open at a casing bottom 14 of the casing 12, and a gas ejection head (shower head) 20 mounted on an upper end of the casing 12.

The casing 12 itself, the casing bottom 14 thereof, and the tubular body 16 have respective heating medium passages 22, 24, 26 defined therein for allowing a heating medium such as oil to pass therethrough. The heating medium passages 22, 24, 26 are connected by external pipes 30 to a main heating medium unit 36 which comprises a delivering device 32 such as a pump and a heating device 34 such as a heater. The substrate processing apparatus includes a coolant circulating unit (not shown) for cooling certain parts of the substrate processing apparatus. A discharge port 38 for discharging generated gases from the reaction chamber 10 is open at the casing bottom 14 and is connected to a vacuum pump (not shown).

The substrate holder 18 is connected by a support shaft 40 to a lifting and lowering device 42 which is positioned below the reaction chamber 10. The substrate holder 18 can be vertically moved in the tubular body 16 by the lifting and lowering device 42. The tubular body 16 has a substrate delivery port 48 defined in a side wall thereof at a certain height and connected by a passage 50 to a gate 52 of a robot chamber 46 which houses a delivery robot 44 therein. A purge gas supply port 54 is open into the substrate delivery port 48. The substrate holder 18 has a heater 56 housed therein for heating a substrate W supported on the substrate holder 18. The substrate W on the substrate holder 18 is maintained at a constant temperature by adjusting an electric current supplied to the heater 56.

As shown in FIG. 2, the gas ejection head 20 comprises an upwardly extending outer barrel 62 having a nozzle disk 60 joined to a lower end thereof which is positioned in facing relationship to the substrate W on the substrate holder 18, an intermediate barrel 64 disposed within and spaced radially inwardly from the outer barrel 62, and an inner barrel 68 disposed within the intermediate barrel 64. The outer barrel 62 and the intermediate barrel 64 jointly define a first gas passageway 66 therebetween, and the inner barrel 68 defines a second gas passageway 70 therein.

A first heating medium passage 74 communicating with a first heating medium unit 72 is defined in peripheral walls of the outer barrel 62 and the intermediate barrel 64, and a second heating medium passage 78 communicating with a second heating medium unit 76 is defined in a peripheral wall of the inner barrel 68. A heat insulation layer 80 made of a heat insulation material is interposed between the intermediate barrel 64 and the inner barrel 68. Gases individually introduced into and flowing in the first and second gas passageways 66, 70 are heated and controlled in temperature by a heating medium flowing through the first heating medium passage 74, and the gas flowing in the second gas passageway 70 is heated and controlled in temperature by a heating medium flowing through the second heating medium passage 78. The heat insulation layer 80 may be replaced with a vacuum space.

The nozzle disk 60 has a number of gas ejection holes (outer nozzle holes) 82 spaced at certain intervals. The intermediate barrel 64 and the inner barrel 68 have openings defined in their respective bottoms in vertical alignment with the gas ejection holes 82 in the nozzle disk 60. Tubular nozzles (inner nozzles) 84 have upper ends fixedly fitted in the openings in the bottoms of the intermediate barrel 64 and the inner barrel 68 and lower ends disposed in the gas ejection holes 82. Annular passages 86 are defined between outer surfaces of the lower ends of the tubular nozzles 84 and inner surfaces of the gas ejection holes 82, and held in communication with the first gas passageway 66. The upper ends of the tubular nozzles 84 are larger in diameter than the lower ends thereof, so that a gas in the tubular nozzles 84 can flow at an increased speed to pass quickly through the gas ejection holes 82. The tubular nozzles 84 may be made of a material of small thermal conductivity in order to minimize the effect of heat from the outer barrel 62 and the intermediate barrel 64.

As shown in FIG. 3, a plurality of pins 90 extend vertically movably through the substrate holder 18. When the pins 90 are lifted, they hold the substrate W in an elevated position above the substrate holder 18. A temperature sensor 92 of the radiation type, for example, is disposed inwardly of the pins 90 and extends vertically through the substrate holder 18, for detecting the temperature of the backside surface of the substrate W.

Several processes of processing a substrate (forming a film on a substrate) with the substrate processing apparatus (film deposition apparatus) having the above structure will be described below.

According to a first process of forming films, material gases including different types of organic metal materials are individually controlled or maintained in temperature and supplied to flow in the first and second gas passageways 66, 70. For example, materials Sr, Bi, and Ta are used to form a film of a ferroelectric Y1. A mixture of the material Sr and an oxidizing gas is supplied to flow in the first gas passageway 66, and a mixture of the materials Bi, Ta and an oxidizing gas is supplied to flow in the second gas passageway 70.

Specifically, the material containing Sr is vaporized by a vaporizer, and a mixture of the vaporized material and an oxidizing gas is introduced into the first gas passageway 66. The mixture gas is maintained at a temperature of 250° C., for example, which is equal to or higher than the vaporization temperature of the material containing Sr and equal to or lower than the decomposition temperature of the material containing Sr. The material containing Bi and Ta is vaporized by a vaporizer, and a mixture of the vaporized material and an oxidizing gas is introduced into the second gas passageway 70. The mixture gas is maintained at a temperature of 180° C., for example, which is equal to or higher than the vaporization temperature of the material containing Bi and Ta and equal to or lower than the decomposition temperature of the material containing Bi and Ta. The oxidizing gas comprises an oxygen-containing gas such as $O_2$, $N_2O$, $H_2O$, etc., or a mixture of such oxygen-containing gas and ozone ($O_3$) produced by an ozonizer.

The temperatures of the various parts of the gas ejection head 20 are controlled as follows: The temperatures of the outer barrel 62 and the intermediate barrel 64, which serve as walls of the first gas passageway 66, are controlled so as to be 250° C. which is the same as the temperature of the Sr-containing material flowing through the first gas passageway 66, by a heating medium flowing through the first heating medium passage 74. The inner barrel 68, which serves as a wall of the second gas passageway 70, is controlled so as to be 180° C. which is the same as the temperature of the Bi, Ta-containing material, by a heating medium flowing through the second heating medium passage 78.

The Sr-containing material gas which has flowed through the first gas passageway 66 passes through the annular passages 86 between the gas ejection holes 82 and the tubular nozzles 84 and is ejected into the reaction chamber 10, and at the same time, the Bi, Ta-containing material gas which has flowed through the second gas passageway 70 is ejected through the tubular nozzles 84 into the reaction chamber 10. As these material gases flowing out of the gas ejection holes 82 and the annular passages 86 descend in the reaction chamber 10, they are mixed uniformly together, and further flow downwardly in the reaction chamber 10 toward the substrate W. In this manner, the organic metal materials can stably be supplied to the reaction chamber 10 while they are being individually controlled at temperatures equal to or higher than their vaporization temperatures and equal to or lower than their decomposition temperatures to prevent themselves from being condensed and decomposed in the passageways leading to the reaction chamber 10.

According to a second process of forming films, a high-temperature oxidizing gas is individually controlled in temperature and supplied to flow in the first gas passageway 66, and a material gas is individually controlled in temperature and supplied to flow in the second gas passageway 70. The material gas is produced by, for example, dissolving organic metal compounds such as $Ba(DPM)_2$, $Sr(DPM)_2$, and $Ti(i-OC_3H_7)_4$ in a solvent, vaporizing the solution, and mixing the vapor with a carrier gas such as Ar or the like. The material gas is maintained at a temperature of 250° C., for example, which is optimum for the constituents thereof to exist stably together.

The temperatures of the various parts of the gas ejection head 20 are controlled as follows: The temperatures of the outer barrel 62 and the intermediate barrel 64, which serve as walls of the first gas passageway 66, are controlled so as to be 500° C., for example, by a heating medium flowing through the first heating medium passage 74 for thereby introducing a high-temperature oxidizing gas into the reaction chamber 10. The oxidizing gas may be preheated to 500° C. or a temperature close thereto. The inner barrel 68, which serves as a wall of the second gas passageway 70, is controlled so as to be 250° C. which is the same as the temperature of the Ba, Sr, Ti-containing material gas, by a heating medium flowing through the second heating medium passage 78.

In the second process of forming films, the temperature of the mixed gas can be made close to about 500° C. optimum for film growth for thereby increasing the film growth rate. If the heating medium is a liquid, then since there is a certain limitation on the rate at which the heating medium can be supplied to the first heating medium passage 74, the temperature to which the mixed gas can actually be heated easily is about 300° C. If the heating medium is a gas, then it is theoretically possible to heat the mixed gas to a temperature of 500° C. or a value close thereto.

In the above embodiment, although the oxidizing gas itself is heated, in place of the heated oxidizing gas, a high-temperature gas which is produced by adding a heated inert gas or $N_2$ gas to the oxidizing gas may be used. This high-temperature gas may be also used in the embodiments described below.

As indicated by the dotted-line curve in FIG. 10, even if the substrate temperature remains the same, the film growth rate can be increased from $V_1$ to $V_2$. Since the material gas ejected out of the tubular nozzles 84 is brought into contact with the high-temperature oxidizing gas, the material gas is prevented from being decomposed and reacting in the gas ejection head 20, and hence from clogging the gas ejection head 20 and causing a reduction in product quality due to formation of particles. Inasmuch as the reactivity of the material gas differs depending on the affinity between the oxidizing gas and the materials, the kind and temperature of the oxidizing gas may be changed as parameters to vary film growth conformability as well as the film growth rate. Unless the reaction between the material gas and the oxidizing gas proceeds in an early stage, the temperature of the oxidizing gas may be increased so as to be equal to or higher than the temperature to which the substrate W is heated, and the oxidizing gas at the increased temperature may be supplied to the reaction chamber 10.

The materials may not be divided depending on their different temperature characteristics, as described above, but may be divided depending on their different reactivities. For example, Sr-based organic materials and Ta-based organic materials tend to react easily with each other in a liquid phase. These materials may react with each other in a gas phase at high temperatures though such a gas-phase reaction is not fully known. Therefore, these materials may be supplied separately from each other, and combined with each other after they are ejected from the gas ejection head.

According to a third process of forming films, a material gas containing an organic metal material gas is individually controlled in temperature and supplied to flow in the second gas passageway 70, and an oxidizing gas is individually controlled in temperature and supplied to flow in the first gas passageway 66, as with the second process of forming films. In the third process of forming films, a film of a ferroelectric, e.g., barium strontium titanate, is formed. The material gas is produced by, for example, dissolving organic metal compounds such as $Ba(DPM)_2$ containing Ti, $Sr(DPM)_2$, and $Ti(i-OC_3H_7)_4$ in a solvent, vaporizing the solution, and mixing the vapor with a carrier gas such as Ar or the like. The oxidizing gas comprises an oxidizing gas having a low temperature.

In the second gas passageway 70, the material gas is heated to a temperature ranging from 240 to 250° C. for example, which is equal to or higher than the vaporization temperature of Sr, Ba, and Ti and equal to or lower than the decomposition temperature thereof, by the heating medium flowing through the second heating medium passage 78. In the first gas passageway 66, the oxidizing gas is heated to a temperature ranging from 100 to 200° C. for example, which is equal to or lower than the temperature of the material gas, by the heating medium flowing through the first heating medium passage 74. The temperature of the oxidizing gas may be slightly lower than the condensation temperature of the material gas, but may be such a value that the material gas is not condensed after they are mixed with each other.

The oxidizing gas which has flowed through the first gas passageway 66 passes through the annular passages 86 between the gas ejection holes 82 and the tubular nozzles 84 and is ejected into the reaction chamber 10, and at the same time, the material gas which has flowed through the second gas passageway 70 is ejected through the tubular nozzles 84 into the reaction chamber 10. As these gases descend in an area (mixing area) below the tubular nozzles 84, they are mixed uniformly together, and further flow downwardly in the reaction chamber 10 toward the substrate W. The substrate W held by the substrate holder 18 has been heated to about 500° C. for example, and a thin film is formed on the heated substrate W.

Figure 8:
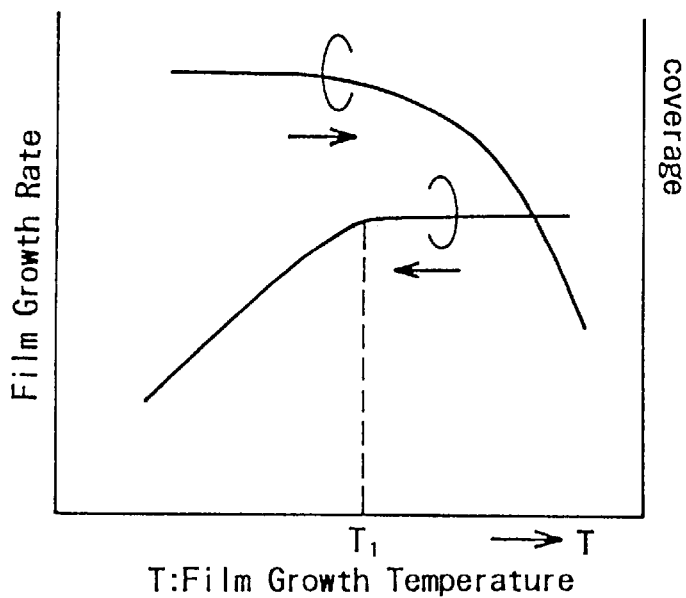
FIG. 8 is a diagram showing the relationship between film growth rates, coverage characteristics, and film growth temperatures.
Figure 9:
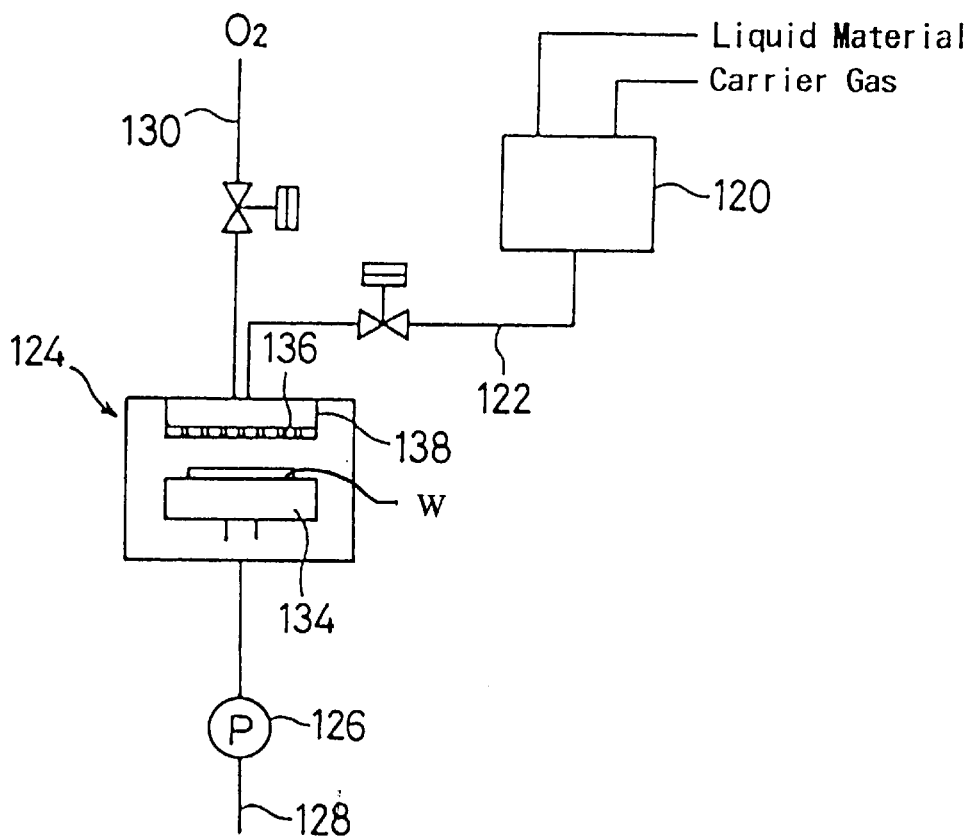
FIG. 9 is a block diagram of a substrate processing apparatus.
Figure 11:
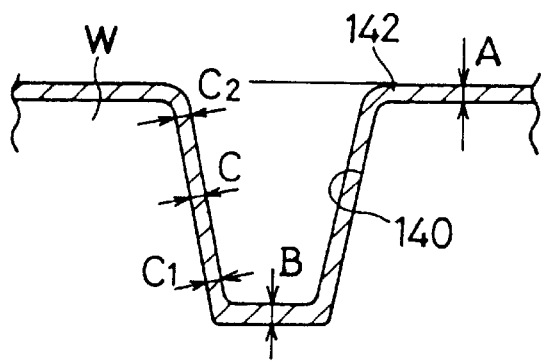
FIG. 11 is a fragmentary cross-sectional view of a film deposited on the surface of a substrate which has a hole defined therein.
Figure 12:
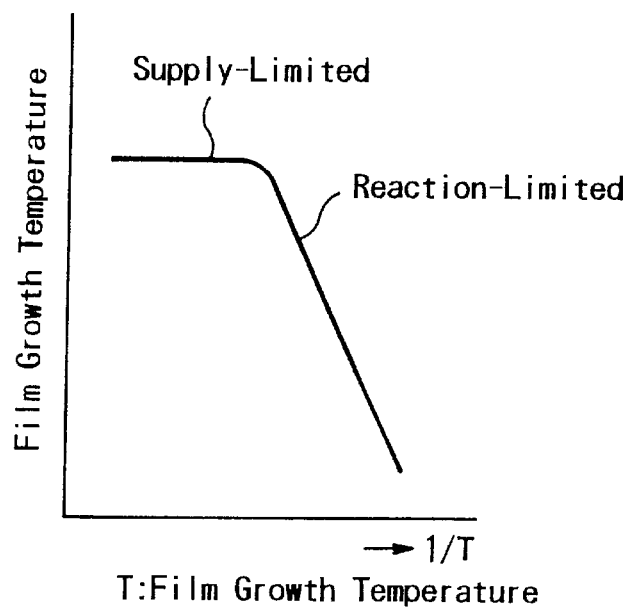
FIG. 12 is a diagram showing an Arrhenius' curve.
Figure 13A:
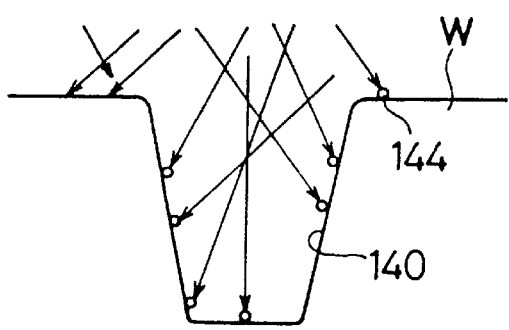
FIG. 13A is a schematic view illustrative of a process of growing a film according to the supply-limited.
Figure 13B:
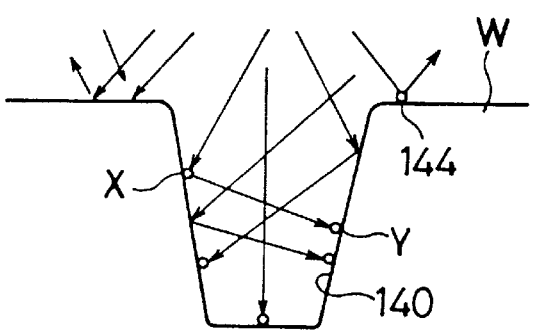
FIG. 13B is a schematic view illustrative of a process of growing a film according to the reaction-limited.

As described above, the film growth rate decreases as the film growth temperature is lowered according to the reaction-limited, and the coverage characteristics are improved as the film growth temperature is lowered. As shown in FIG. 8, the coverage characteristics are high in the vicinity of a temperature $T_1$ where the supply-limited changes to the reaction-limited. When the temperature of the oxidizing gas is adjusted so as to be lower than the temperature of the material gas without changing the temperature of the material gas such that the film growth temperature is slightly higher than the temperature $T_1$ where the supply-limited changes to the reaction-limited, the coverage characteristics can be improved while maintaining a high film growth rate.

While a BST film growth process has been described above as the third process of forming films, the third process of forming films is also applicable to a process of forming a seed layer for wiring of Cu. In such a process, the temperature of an additive gas such as $O_2$, or $H_2O$ is made slightly lower than the temperature of the material gas.

According to a fourth process of forming films, material gases containing different types of organic metal materials are individually controlled in temperature and supplied to flow in the first and second gas passageways 66, 70, as with the first process of forming films. The fourth process of forming films is applied to a BST material system of high-dielectric materials including Ti, for example. A mixture of material gases of Ba, Sr is supplied to flow in the first gas passageway 66, and a mixture of a material gas of Ti and an oxidizing gas is supplied to flow in the second gas passageway 70. Specifically, a vapor produced by vaporizing material of Ba, Sr with a vaporizer is introduced into the first gas passageway 66, and a mixture of a vapor produced by vaporizing material of Ti with a vaporizer and an oxidizing gas is introduced into the second gas passageway 70.

In the first gas passageway 66, the mixed gas is heated to a temperature ranging from 240 to 250° C., for example, which is equal to or higher than the vaporization temperature of Sr, Ba and equal to or lower than the decomposition temperature thereof, by the heating medium flowing through the first heating medium passage 74. In the second gas passageway 70, the mixed gas is heated to a temperature ranging from 150 to 200° C., for example, which is equal to or higher than the vaporization temperature of Ti and equal to or lower than the decomposition temperature thereof, and also equal to or lower than the mixed gas flowing through the second gas passageway 70, by the heating medium flowing through the second heating medium passage 78. These mixed gases are supplied from the gas ejection head 20 into the reaction chamber 10 for thereby forming a thin film on the surface of the substrate W held on the substrate holder 18.

In forming a film of BST, STO, BTO, or the like, since the process is carried out via Ti, the material of Ti largely contributes to the coverage characteristics. Because the organic metal material of Ti has a vaporization temperature lower than other organic metal materials of Ba, Sr, etc., even if the organic metal material of Ti can individually be lowered in temperature separately from the other organic metal materials and vaporized, the organic metal material of Ti can be delivered without being condensed. Therefore, when only the titanium material is made lower in temperature than the other materials, the reaction of titanium can be delayed for improving the coverage characteristics.

According to a fifth process of forming films, a process described below is added to each of the above first through fourth processes of forming films. The substrate holder 18 is maintained at a predetermined film growth temperature, and the pins 90 are elevated. Then, a substrate W on which a film is to be grown is delivered into the reaction chamber 10 by the delivery robot 44, and placed on the pins 90 projecting from the substrate holder 18. The substrate W which is of a relatively low temperature is thus prevented from suffering a thermal shock from direct contact with the substrate holder 18. With the substrate W held by the pins 90, the substrate holder 18 is lifted to move the substrate W closely toward the gas ejection head 20.

Then, a heating gas (temperature-adjusting gas) which has been heated to a target temperature to which the substrate W is to be heated or a temperature higher than the target temperature is introduced into the gas ejection head 20, and flows through the first gas passageway 66 and is ejected from the annular passages 86 toward the substrate W, thereby preheating the substrate W. The heating gas comprises an $N_2$ gas or an inert gas which does not pose problems with regard to the process of forming films. An annealing may be performed after forming a film. In order to perform such annealing, for example, the substrate is heated to a certain temperature by $N_2$ gas, and the $N_2$ gas is replaced by a gas for annealing. If no problems are posed on the process of forming films, then an $H_2$ gas having a large specific heat and thermal conductivity may be used to increase the ability for increasing the temperature of the substrate W. The rate at which the temperature of the substrate W is increased may also be increased by increasing the pressure of the heating gas.

The temperature of the surface of the substrate W is detected by the temperature sensor 92, and when the detected temperature reaches a target temperature, the supply of the heating gas is stopped. If a heating gas having a temperature higher than the target temperature is used, then when the detected temperature reaches a value near the target temperature, the heating gas may be replaced by a heating gas having a temperature equal to the target temperature. By controlling the rate, temperature, pressure, etc. of the heating gas while detecting the temperature of the backside surface of the substrate W, the substrate W can be heated to a desired temperature within a predetermined period of time.

When the substrate W reaches the target temperature, the pins 90 are lowered to place the substrate W onto the substrate holder 18, and a film growth process is carried out on the substrate W while the temperature of the substrate W is being controlled so as to be constant by the heater 56. Specifically, for example, a high-temperature oxidizing gas is individually controlled in temperature and supplied to flow in the first gas passageway 66, and a material gas is individually controlled in temperature and supplied to flow in the second gas passageway 70. The material gas is produced by, for example, dissolving organic metal compounds such as $Ba(DPM)_2$, $Sr(DPM)_2$ and $Ti(i-OC_3H_7)_4$ in a solvent, vaporizing the solution, and mixing the vapor with a carrier gas such as Ar or the like. These gases are ejected toward the substrate W to grow a thin film on the surface of the substrate W.

After the film has been formed, the pins 90 are elevated, and hold the processed substrate W above the substrate holder 18. Then, a cooling gas (temperature-adjusting gas) which has been cooled to a target temperature or a temperature lower than the target temperature is introduced into the gas ejection head 20, and flows through the first gas passageway 66 and is ejected from the annular passages 86 toward the substrate W, thereby cooling the substrate W. As with the heating gas described above, the cooling gas comprises an $N_2$ gas or an inert gas which does not pose problems with regard to the process of forming films. If no problems are posed with regard to the process of forming films, then an $H_2$ gas may be used to increase the ability for lowering the temperature of the substrate W.

The temperature of the backside surface of the substrate W is detected by the temperature sensor 92, and when the detected temperature reaches the target temperature, the substrate holder 18 is lowered and the substrate W is transferred to the delivery robot 44. The substrate W can thus quickly be cooled to avoid a thermal shock due to the temperature difference between the hand of the delivery robot 44 and the substrate W. The substrate W taken out of the reaction chamber 10 may be returned via a cooling chamber or directly into a cassette of resin positioned in a load-lock chamber, for example. While the throughput can be increased by using a separate cooling chamber, the substrate W can be cooled by a primary cooling according to the above cooling process for lowering the effect of heat held by the substrate W on the robot hand, thereby increasing the service life of the robot hand.

In this process of forming films, the first gas passageway 66 for supplying an oxidizing gas with no material contained therein is used to supply both the heating gas and the cooling gas. However, a third gas passageway dedicated for supplying both the heating gas and the cooling gas may additionally be employed. Instead of heating the substrate W while the substrate W is being held by the pins 90, the substrate W may be heated directly on the substrate holder 18 if the introduced substrate W has a certain temperature and does not cause a heat shock. While the formation of a film of a high-dielectric material has been described above, a process of forming films for embedding a wiring metal of copper in wiring grooves in a substrate may be carried out.

In the above film forming processes, a process in which a film formed on a substrate in an oxidizing gas atmosphere is composed of oxides has been described. Next, a process in which a film formed on a substrate in a reducing gas atmosphere is composed of metals, for example, will be described with reference to FIG. 4. As an example, a Cu seed layer for wiring of Cu will be described. First, Cu(hfac (hexafluoroacetylacetone))tmvs(trimetylvinylsilane), tmvs (5%) and H(hfac) are mixed to produce a liquid material 202. The liquid material 202 stored in a container 200 is supplied to a vaporizer 206 through a liquid flow controller 204 by pressurizing a liquid level with a gas such as He, and at the same time, a carrier gas such as He, $H_2$, or Ar, is supplied to the vaporizer 206 through a gas flow controller 208. In the vaporizer 206, the liquid material and the carrier gas are heated to a temperature ranging from 50 to 70° C., for example, to be vaporized, thus generating a material gas. Then, the material gas is individually controlled in temperature and supplied to flow in the first gas passageway 66, and an additive gas such as $H_2$, Ar, $N_2$ or $H_2$ is individually controlled in temperature and supplied to flow in the second gas passageway 70. These gases are ejected toward a substrate W placed on the substrate holder 18 which is heated to a temperature ranging from 140 to 200° C., for example. Gases discharged from the reaction chamber and part of material gasses are introduced into traps 210a, 210b, respectively, in which components contained in the discharged gases and the material gas are partly trapped, and untrapped components are discharged from a dust removing device 214 through a vacuum pump 212.

In this manner, copper is deposited on a surface of the substrate W by the following reaction formulas (1) and (2).

$$Cu(hfac)tmvs \rightarrow Cu(hfac) + tmvs \quad (1)$$

$$2Cu(hfac) \rightarrow Cu(hfac)_2 + Cu \quad (2)$$

In this case, the reaction expressed by the formula (1) is an endothermic reaction, and it is desirable that such reaction is carried out in a vapor phase. Thus, by supplying an additive gas which has been heated, the material gas and the additive gas are mixed with each other immediately after they are ejected from the gas ejection head 20, and the reaction expressed by the formula (1) is accelerated.

Figure 5:
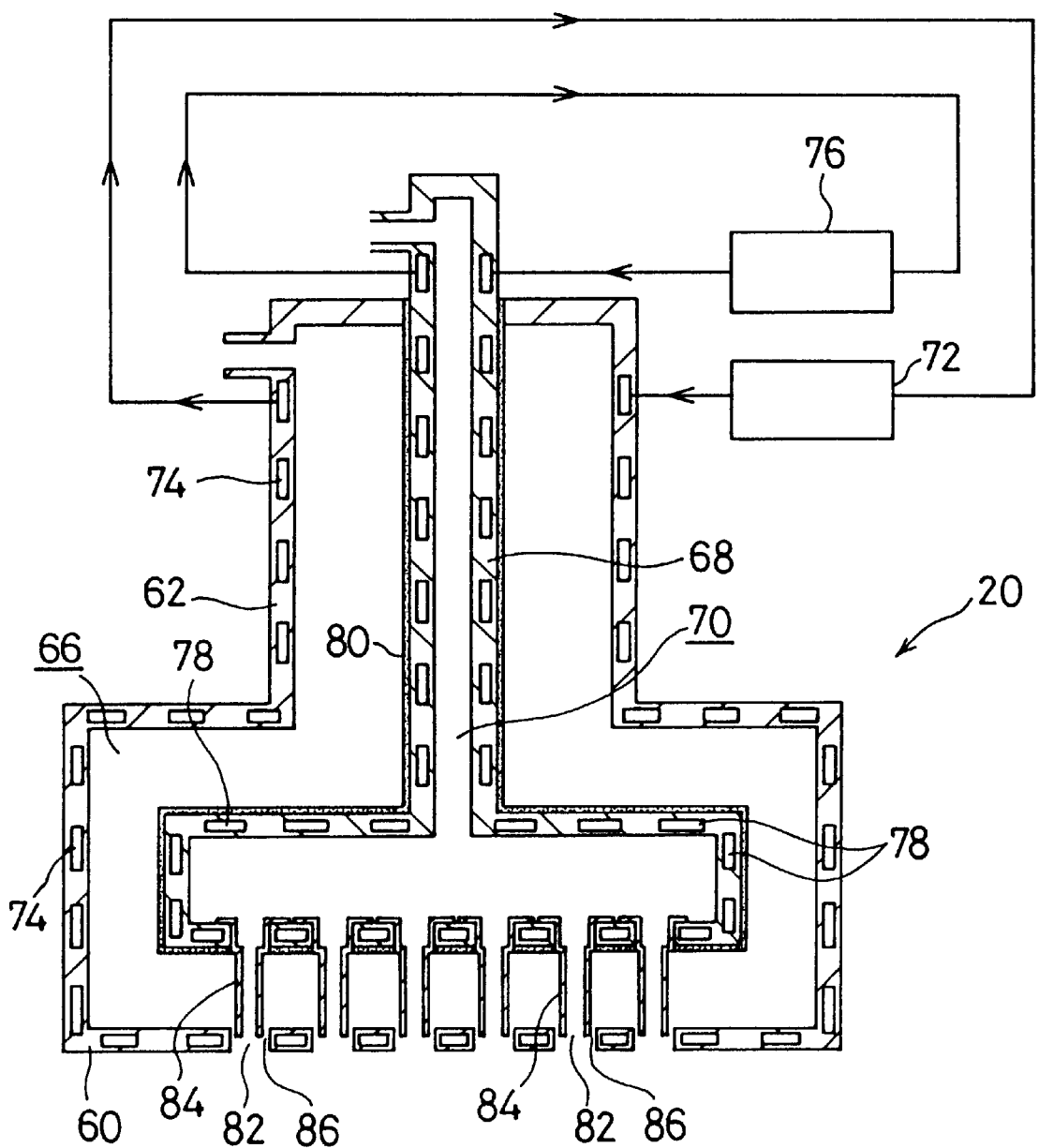
FIG. 5 is a schematic cross-sectional view of a gas ejection head in a substrate processing apparatus according to a second embodiment of the present invention.

FIG. 5 shows a gas ejection head 20 of a substrate processing apparatus according to a second embodiment of the present invention. According to the second embodiment, as shown in FIG. 5, the intermediate barrel of the gas ejection head according to the first embodiment is dispensed with, and the first gas passageway 66 is defined between the outer barrel 62 and the inner barrel 68, and the second gas passageway 70 is defined in the inner barrel 68, with the outer circumferential surface of the inner barrel 68 being covered with the heat insulation layer 80. The heat insulation layer 80 may comprise a heat insulation liner or a heat insulation coating for simplifying the structure of the gas ejection head 20 and reducing the rate of flow of the heating medium.

FIG. 6 shows a gas ejection head 20 of a substrate processing apparatus according to a third embodiment of the present invention. As shown in FIG. 6, the gas ejection head 20 has a combiner 94 in its upper portion, a first gas pipe 96 defining a first gas passageway and connected tangentially to the combiner 94, a second gas pipe 98 defining a second gas passageway and connected tangentially to the combiner 94, and a downwardly flaring ejected gas guide pipe 100 extending downwardly from the combiner 94 and spreading toward the substrate holder 18. The gas ejection head 20 according to the third embodiment is particularly suitable for performing the second process of forming films. Heat insulating mechanisms 96a, 98a are disposed respectively around the gas pipes 96, 98 for thermally insulating gases flowing through the gas pipes 96, 98.

When the second process of forming films is carried out by the gas ejection head 20 according to the third embodiment, a material gas and a high-temperature oxidizing gas flow respectively through the gas pipes 96, 98, and are combined with each other by the combiner 94. The combined gases then flow downwardly in a swirling motion through the ejected gas guide pipe 100, are mixed with each other, and finally reach the surface of the substrate W beneath the ejected gas guide pipe 100. The gas ejection head 20 shown in FIG. 6 is effective to increase the film growth reaction rate while preventing the material gas from being decomposed and reacting in the gas ejection head 20.

Figure 7:
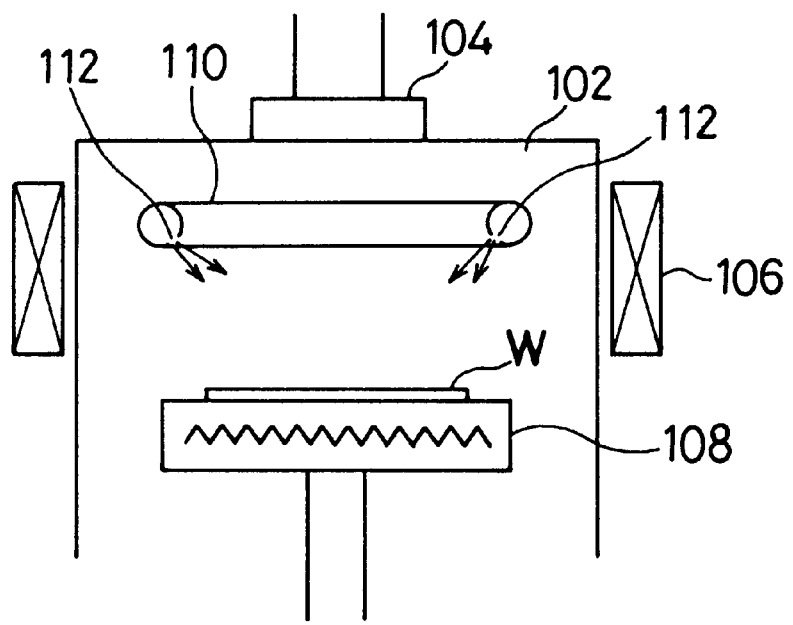
FIG. 7 is a schematic view of a substrate processing apparatus according to a fourth embodiment of the present invention.

FIG. 7 shows a substrate processing apparatus according to a fourth embodiment of the present invention. As shown in FIG. 7, a microwave introducing device 104 for introducing a microwave having a frequency of 2.45 GHz, for example, is mounted on an upper wall of a reaction chamber 102, and a magnet coil 106 of 875 G, for example, is disposed around the reaction chamber 102, for processing a substrate W placed on a substrate holder 108 with a plasma. A ring-shaped gas inlet pipe 110 is disposed in an upper space in the reaction chamber 10 and extends longitudinally thereof. The ring-shaped gas inlet pipe 110 has a plurality of gas ejection ports 112 defined therein and spaced at a certain pitch in the circumferential direction thereof. The gas ejection ports 112 eject a temperature-adjusting gas obliquely downwardly toward the substrate W placed on the substrate holder 108.

The substrate processing apparatus according to the fourth embodiment is suitable for performing the fifth process of forming films described above. Though the substrate processing apparatus according to the fourth embodiment does not have a gas ejection head due to structural limitations, the gas ejection ports defined in the ring-shaped gas inlet pipe disposed in the upper space of the reaction chamber can uniformly introduce the temperature-adjusting gas into the reaction chamber.

As described above, according to the present invention, the at least two gases including the material gas can individually be controlled in temperature irrespectively of each other and set to temperatures optimum for processing a substrate, e.g., forming a film on the substrate, and then ejected from the gas ejection head toward the substrate. The gases containing the at least two different organic metal materials can individually be set to desired temperatures irrespectively of each other without limitation of characteristics of material gas, or the like. The gases thus set to the desired temperatures do not react prematurely and are not decomposed in passageways. When the gases are finally mixed with each other, they can be kept at a higher temperature for an increased film growth reaction rate.

Further, the oxidizing gas and the material gas containing organic metal of Titanium (Ti) which are hard to be condensed are lowered in temperature, and the temperature of film growth is lowered to a temperature close to a transition range from the reaction-limited to the supply-limited. Therefore, the coverage characteristics of the film growth can be improved without lowering the film growth rate.

Further, by heating (preheating) and/or cooling the substrate uniformly and quickly to a temperature equal to the target temperature, the throughput can be increased.

Although certain preferred embodiments of the present invention have been shown and described in detail, it should be understood that various changes and modifications may be made therein without departing from the scope of the appended claims.

What is claimed is:

1. An apparatus for processing a substrate, comprising:
   a gas ejection head to individually receive at least two gases including a material gas, and eject the at least two gases toward a substrate to be processed, wherein said gas ejection head includes
   (i) at least two gas passageways through which the at least two gases are to individually flow, and
   (ii) at least two temperature control devices to individually control or maintain temperatures of the at least two gases as the at least two gases individually flow through said at least two gas passageways.

2. The apparatus according to claim 1, wherein said gas ejection head is to individually receive at least two gases by individually receiving at least two gases each containing at least two different organic metal materials.

3. The apparatus according to claim 1, wherein said gas ejection head is to individually receive at least two gases by individually receiving at least two gases one of which comprises a high-temperature gas containing at least one of an oxidizing gas, $N_2$, and an inert gas.

4. The apparatus according to claim 1, wherein said gas ejection head is to individually receive at least two gases by individually receiving at least two gases one of which comprises a high-temperature gas containing at least one of a reducing gas, $N_2$, and an inert gas.

5. The apparatus according to claim 1, wherein said gas ejection head is to individually receive at least two gases by individually receiving at least two gases one of which comprises a temperature-adjusting gas for performing at least one of heating the substrate and cooling the substrate.

6. The apparatus according to claim 1, wherein said at least two temperature control devices are to individually control and maintain the temperatures of the at least two gases as the at least two gases individually flow through said at least two gas passageways by controlling or maintaining the temperatures of the at least two gases irrespectively of one another as the at least two gases individually flow through said at least two gas passageways, whereby each of the at least two gases is set to its optimum temperature.

7. The apparatus according to claim 1, wherein said gas ejection head is to individually receive at least two gases and eject the at least two gases toward a substrate to be processed by causing the at least two gases to individually flow through said at least two gas passageways without being mixed with one another and then to become mixed with one another after being ejected from said at least two gas passageways toward the substrate.

8. The apparatus according to claim 1, further comprising:
   a first system to supply one of said at least two gases to one of said at least two gas passageways absent any other of said at least two gases; and
   a second system to supply another of said at least two gases to another of said at least two passageways absent any other of said at least two gases.

9. The apparatus according to claim 1, wherein one of said at least two gas passageways is defined by a first structure and another of said at least two gas passageways is defined by a second structure, wherein one of said at least two temperature control devices comprises a first passage in said first structure adjacent to said one of said at least two gas passageways, through which first passage a heating or cooling medium can flow, and wherein another of said at least two temperature control devices comprises a second passage in said second structure adjacent to said another of said at least two gas passageways, through which second passage a heating or cooling medium can flow.

10. An apparatus for processing a substrate, comprising:
    a processing chamber having a gas ejection head to individually receive at least two gases including a material gas, and eject the at least two gases toward a substrate to be processed, wherein said gas ejection head includes
    (i) at least two gas passageways through which the at least two gases are to individually flow, and
    (ii) at least two temperature control devices to individually control or maintain temperatures of the at least two gases as the at least two gases individually flow through said at least two gas passageways;
    a gas supply source to supply the at least two gases to said gas ejection head; and
    a substrate holder disposed in said processing chamber in confronting relationship to said gas ejection head.

11. The apparatus according to claim 10, wherein said at least two temperature control devices are to individually control and maintain the temperatures of the at least two gases as the at least two gases individually flow through said at least two gas passageways by controlling or maintaining the temperatures of the at least two gases irrespectively of one another as the at least two gases individually flow through said at least two gas passageways, whereby each of the at least two gases is set to its optimum temperature.

12. The apparatus according to claim 10, wherein said gas ejection head is to individually receive at least two gases and eject the at least two gases toward a substrate to be processed by causing the at least two gases to individually flow through said at least two gas passageways without being mixed with one another and then to become mixed with one another after being ejected from said at least two gas passageways toward the substrate.

13. The apparatus according to claim 10, further comprising:
    a first system to supply one of said at least two gases to one of said at least two gas passageways absent any other of said at least two gases; and
    a second system to supply another of said at least two gases to another of said at least two passageways absent any other of said at least two gases.

14. The apparatus according to claim 10, wherein one of said at least two gas passageways is defined by a first structure and another of said at least two gas passageways is defined by a second structure, wherein one of said at least two temperature control devices comprises a first passage in said first structure adjacent to said one of said at least two gas passageways, through which first passage a heating or cooling medium can flow, and wherein another of said at least two temperature control devices comprises a second passage in said second structure adjacent to said another of said at least two gas passageways, through which second passage a heating or cooling medium can flow.

15. An apparatus for processing a substrate, comprising:
    a processing chamber to process a substrate therein;
    a substrate holder disposed in said processing chamber, to hold and heat said substrate; and
    a temperature-adjusting gas introducing device to introduce a temperature-adjusting gas into said processing chamber for performing at least one of heating the substrate and cooling the substrate at a predetermined position within said processing chamber, wherein said temperature-adjusting gas introducing device includes a gas ejection head to individually receive at least two gases, and eject the at least two gases toward a substrate to be processed, wherein said gas ejection head includes
(i) at least two gas passageways through which the at least two gases are to individually flow, and
(ii) at least two temperature control devices to individually control or maintain temperatures of the at least two gases as the at least two gases individually flow through said at least two gas passageways.

16. The apparatus according to claim 15, wherein said at least two temperature control devices are to individually control and maintain the temperatures of the at least two gases as the at least two gases individually flow through said at least two gas passageways by controlling or maintaining the temperatures of the at least two gases irrespectively of one another as the at least two gases individually flow through said at least two gas passageways, whereby each of the at least two gases is set to its optimum temperature.

17. The apparatus according to claim 15, wherein said gas ejection head is to individually receive at least two gases and eject the at least two gases toward a substrate to be processed by causing the at least two gases to individually flow through said at least two gas passageways without being mixed with one another and then to become mixed with one another after being ejected from said at least two gas passageways toward the substrate.

18. The apparatus according to claim 15, further comprising:
a first system to supply one of said at least two gases to one of said at least two gas passageways absent any other of said at least two gases; and
a second system to supply another of said at least two gases to another of said at least two passageways absent any other of said at least two gases.

19. The apparatus according to claim 15, wherein one of said at least two gas passageways is defined by a first structure and another of said at least two gas passageways is defined by a second structure, wherein one of said at least two temperature control devices comprises a first passage in said first structure adjacent to said one of said at least two gas passageways, through which first passage a heating or cooling medium can flow, and wherein another of said at least two temperature control devices comprises a second passage in said second structure adjacent to said another of said at least two gas passageways, through which second passage a heating or cooling medium can flow.

* * * * *